United States Patent
Ashry Othman (10) Patent No.: US 10,027,355 B2
(45) Date of Patent: Jul. 17, 2018

(54) BLOCKER DETECTION BASED AUTOMATIC GAIN CONTROL

(71) Applicant: Analog Devices Global, Hamilton (BM)

(72) Inventor: Ahmed Mohammad Ashry Othman, Cairo (EG)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/000,515

(22) Filed: Jan. 19, 2016

(65) Prior Publication Data
US 2017/0207801 A1   Jul. 20, 2017

(51) Int. Cl.
*H04L 25/03* (2006.01)
*H04B 1/04* (2006.01)
*H04B 17/345* (2015.01)

(52) U.S. Cl.
CPC ......... *H04B 1/0475* (2013.01); *H04B 17/345* (2015.01); *H04B 2001/0416* (2013.01)

(58) Field of Classification Search
CPC ........................... H04B 1/0475; H04B 17/345
USPC ......................................... 375/297, 295, 296
See application file for complete search history.

(56) References Cited

U.S. PATENT DOCUMENTS

| | | | | |
|---|---|---|---|---|
| 4,872,206 A * | 10/1989 | Graziadei | ............ | H03G 3/3068 455/241.1 |
| 5,142,695 A * | 8/1992 | Roberts | ................ | H03G 3/3052 455/234.1 |
| 5,940,143 A * | 8/1999 | Igarashi | ............... | H03G 3/3052 348/678 |
| 6,771,719 B1 * | 8/2004 | Koyama | ............. | H03G 3/3068 375/345 |
| 7,812,673 B1 * | 10/2010 | Gilbert | .................. | H03F 1/0277 330/279 |
| 8,233,869 B2 * | 7/2012 | Sarapin | .................. | H03G 1/007 455/232.1 |

(Continued)

OTHER PUBLICATIONS

J. P. Alegre Pérez, et al., "*Automatic Gain Control*," Analog Circuits and Signal Processing, Chapter 2: ACG Fundamentals, pp. 13-28, Springer Science+Business Media (2011).

(Continued)

*Primary Examiner* — Helene Tayong
(74) *Attorney, Agent, or Firm* — Knobbe Martens Olson & Bear LLP (57) ABSTRACT

Modular gain control based on blocker signal detection is disclosed herein. In a multi-stage gain control scheme for a receiver, the input stage gain or the pre-mixing stage gain can be controlled for effective blocker rejection based on detecting a blocker signal at a mixer, and the output stage gain or the post-mixing stage gain can be controlled to restore and maintain an appropriate output level after pre-mixing gain reduction performed for blocker rejection. Accordingly, the RF communication systems herein can include multiple loops for providing AGC. In particular, an RF communication system can include a main loop and a blocker loop used to override the main loop when the blocker signal is detected. In certain configurations, the blocker loop reduces the gain of an RF VGA, while the main loop will increase the gain of an IF VGA to restore the output power.

20 Claims, 8 Drawing Sheets

(56) References Cited

U.S. PATENT DOCUMENTS

| | | | |
|---|---|---|---|
| 8,456,237 B2* | 6/2013 | Huang | H03F 1/34 |
| | | | 330/279 |
| 2004/0137941 A1* | 7/2004 | Tanaka | H04B 1/30 |
| | | | 455/552.1 |
| 2007/0076828 A1* | 4/2007 | Choi | H03G 3/001 |
| | | | 375/345 |
| 2008/0242249 A1* | 10/2008 | Gomez | H03G 1/0088 |
| | | | 455/234.1 |
| 2012/0319774 A1* | 12/2012 | Ibrahim | H03G 3/3068 |
| | | | 330/129 |
| 2014/0080549 A1* | 3/2014 | Li | H04W 52/52 |
| | | | 455/571 |
| 2014/0162573 A1* | 6/2014 | Laskar | H04B 1/403 |
| | | | 455/73 |
| 2015/0162924 A1* | 6/2015 | Takaike | H03M 1/12 |
| | | | 341/118 |

OTHER PUBLICATIONS

Hank Zumbahlen, Ed., Basic Linear Design, Chapter 4: RF/IF Circuits, pp. 4.1-4.72, Analog Devices, Inc. (2007).

Dana Whitlow, ADI Wireless Seminar 2006 materials, Chapter VIII: Design and Operation of Automatic Gain Control Loops for Receivers in Modern Communications Systems, pp. VIII-1-VIII-12, Analog Devices, Inc. (2006).

* cited by examiner

BLOCKER DETECTION BASED AUTOMATIC GAIN CONTROL

BACKGROUND

Field

Embodiments of the invention relate to electronic systems, and more particularly, to automatic gain control for radio frequency communication systems.

Description of the Related Art

Automatic gain control (AGC) can be used in various applications, including radio frequency (RF) communication systems. AGC can be implemented using a variable gain amplifier (VGA) in a loop, such as a feedback or feedforward AGC loop.

For example, an RF communication system can include a feedback AGC loop that adjusts a VGA control voltage with reference to a reference voltage. Presence of a blocker signal or an off-frequency signal near the RF communication system's receiver can influence gain and signal-to-noise ratio (SNR). Achieving suitable blocking rejection of such blocker signals can be challenging.

SUMMARY

The methods and devices of the described technology each have several aspects, no single one of which is solely responsible for its desirable attributes.

In one aspect, a communications system includes a first amplifier including an input configured to receive an input signal and an output that provides an amplified signal, the first amplifier configured to receive a first gain control signal that controls a variable gain of the first amplifier, a second amplifier including an input and an output, the second amplifier configured to receive a second gain control signal that controls a variable gain of the second amplifier, a mixer including a mixer input electrically connected to the output of the first amplifier and a mixer output electrically connected to the input of the second amplifier, wherein the mixer is configured to provide mixing to the amplified signal, a primary loop that controls the second gain control signal based on the output of the second amplifier, and a blocker loop that controls the first gain control signal to reduce the variable gain of the first amplifier in response to detecting presence of a blocker signal at the mixer output.

In another aspect, a method for automatic gain control in a communications system includes amplifying an input signal to generate an amplified signal using a first amplifier, controlling a variable gain of the first amplifier using a first gain control signal, generating a mixed signal at an output of a mixer based on mixing the amplified signal, amplifying the mixed signal to generate an output signal using a second amplifier, controlling a variable gain of the second amplifier using a second gain control signal, controlling the second gain control signal based on the output signal using a primary loop, detecting presence of a blocker signal at the output of the mixer using a blocker loop, and controlling the first gain control signal using the blocker loop to reduce the variable gain of the first amplifier in response to detecting the presence of the blocker signal.

In another aspect, a receiver includes a first amplifier including an input configured to receive an input signal and an output that provides an amplified signal, the first amplifier configured to receive a first gain control signal that controls a variable gain of the first amplifier, a second amplifier including an input and an output, the second amplifier configured to receive a second gain control signal that controls a variable gain of the second amplifier, a mixer including a mixer input electrically connected to the output of the first amplifier and a mixer output electrically connected to the input of the second amplifier, wherein the mixer is configured to provide mixing to the amplified signal, a means for controlling the second gain control signal based on the output of the second amplifier, and a means for controlling the first gain control signal in response to detecting presence of a blocker signal at the mixer output.

BRIEF DESCRIPTION OF THE DRAWINGS

These drawings and the associated description herein are provided to illustrate specific embodiments of the described technology and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass apparatus and/or methods which are practiced using structure and/or functionality in addition to or different than the various aspects set forth herein. It should be understood that any aspect disclosed herein might be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

A radio frequency (RF) communication system, such as a receiver, can be specified to handle a certain blocker test. For instance, in point-to-point communication applications, a blocker signal may be +30 dB higher than a threshold signal power. An RF communication system with robust blocker test performance can exhibit excellent receiver sensitivity in the presence of a relatively large blocker signal. For instance, an RF communication system may operate in the presence of a high power blocker signal adjacent in frequency to an RF signal of interest, and an RF communication system with good blocking performance can nevertheless detect the RF signal when the blocker signal is present.

A blocker signal can degrade an RF communication system's performance in a variety of ways. For instance, the blocker signal can push the RF communication system's circuitry into saturation, thereby degrading linearity, such as by increasing third-order intermodulation (IM3). For instance, the blocker signal may be sufficiently strong to cause a low noise amplifier (LNA) to reach compression, thereby degrading the LNA's linearity. Moreover, a blocker signal can mix with the RF communication system's local oscillator (LO) phase noise and degrade signal-to-noise ratio (SNR).

An RF communication system can include a single loop used to control output power to provide automatic gain control (AGC). For example, the single loop can be implemented to provide AGC by controlling a gain of an intermediate frequency (IF) variable gain amplifier (VGA).

Modular gain control based on blocker signal detection is disclosed herein. In a multi-stage gain control scheme for a receiver circuit, the input stage gain or the pre-mixing stage gain can be controlled for effective blocker rejection based on detecting a blocker signal at an output of a mixer. Additionally, the output stage gain or the post-mixing stage gain can be controlled to restore and maintain an appropriate output level after pre-mixing gain reduction performed for blocker rejection, if any.

Accordingly, the RF communication systems herein can include multiple loops for providing AGC. In particular, an RF communication system can include a main loop and an auxiliary or blocker loop used to override the main loop when the blocker signal is detected. In certain configurations, the blocker loop reduces the gain of an RF VGA, while the main loop will increase the gain of an IF VGA to restore the output power.

In certain configurations, the blocker loop is selectively activated based on comparing an output power of a mixer to a threshold. The threshold can have a variety of levels, and can be selected to achieve superior linearity and noise performance, such as relatively low IM3/SNR degradation at blocker conditions.

Figure 1:
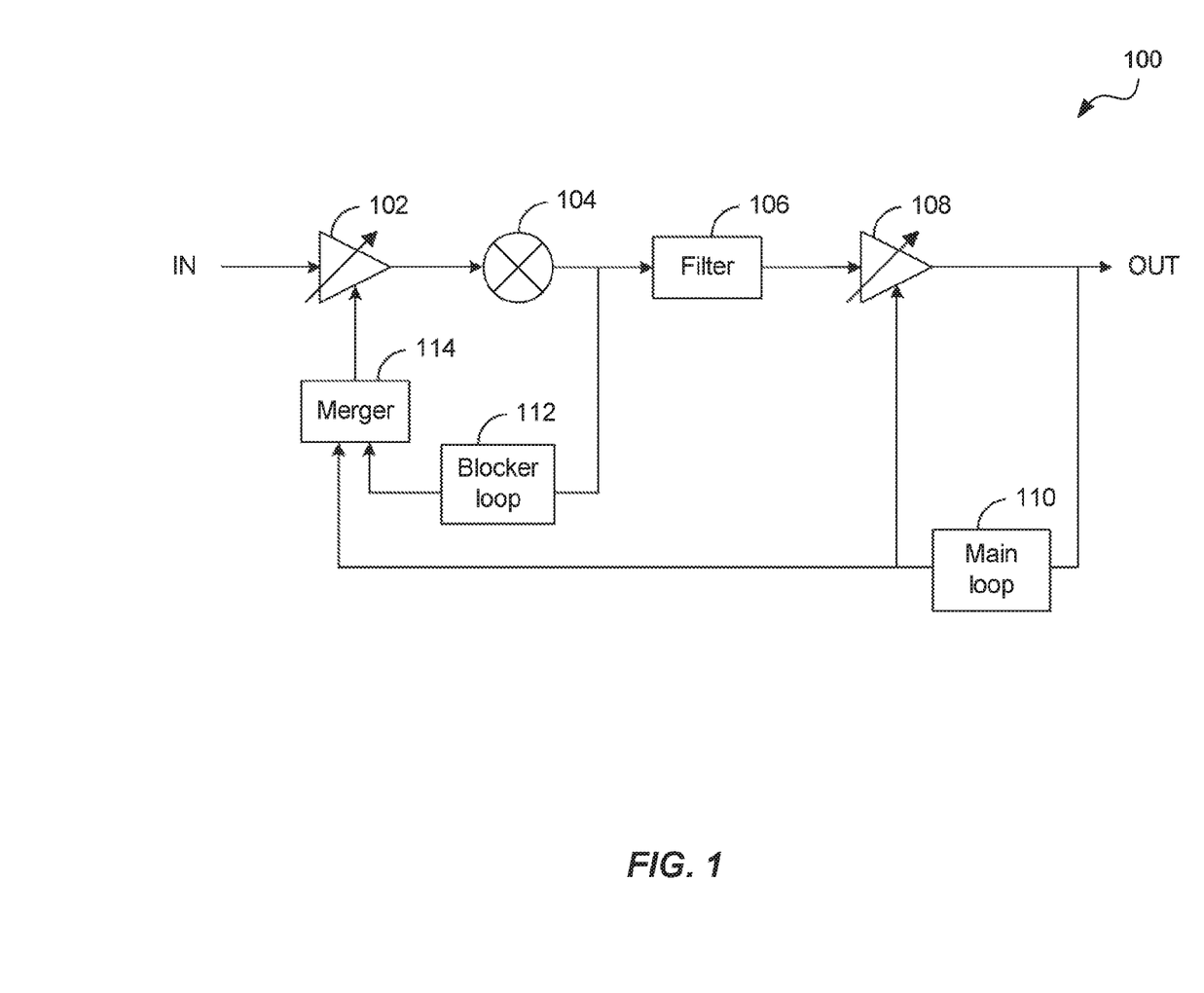
FIG. 1 is a schematic diagram of one embodiment of a gain control circuit for a communications system.

FIG. 1 is a schematic diagram of one embodiment of a gain control circuit for a communications system, such as an RF receiver. The illustrated gain control circuit 100 of FIG. 1 includes an input amplifier 102 that receives an input signal, IN, of the circuit 100, a mixer 104 that receives an output from the input amplifier 102, a filter 106, and an output amplifier 108 that receives a filtered output from the filter 106 and provides an output signal, OUT, of the circuit 100. The gain control circuit 100 also includes a blocker loop 112, a main loop 110, and a merger circuit 114.

As shown in FIG. 1, the blocker or auxiliary loop 112 receives a mixer output from the mixer 104 and provides a control signal to the merger circuit 114. Additionally, the main loop 110 receives the output signal, OUT, and provides control signals to the output amplifier 108 and to the merger circuit 114. Accordingly, the merger circuit 114 receives a first control signal from the blocker loop 112 and a second control signal from the main loop 110 and provides a merged or combined control signal to the input amplifier 102.

The illustrated gain control circuit 100 can be implemented, for example, in an RF communication system. In certain configurations, the gain control circuit 100 is included in a superheterodyne receiver, and the input signal, IN, corresponds to a received radio frequency (RF) signal. For example, in one embodiment, the input amplifier 102 is implemented as an RF VGA, the output amplifier 108 is implemented as an IF VGA, and the output signal OUT corresponds to an IF signal that can be down-converted to baseband using another mixer (not shown in FIG. 1).

As shown in FIG. 1, the input amplifier 102 and the output amplifier 108 have controllable gain. In certain configurations, the input amplifier 102 and the output amplifier 108 are each implemented as a VGA having a variable gain that is controlled by a control signal, such as a control voltage.

In the illustrated embodiment, the input amplifier 102 receives the input signal, IN, of the circuit 100 and amplifies or attenuates the input signal, IN, based on the combined control signal it receives from the merger circuit 114. Additionally, the input amplifier 102 outputs the amplified input signal to the mixer 104. In embodiments implemented in an RF receiver, the input amplifier 102 can be an RF VGA, in which case the input signal, IN, is an RF signal, and the mixer 104 receives an amplified RF signal. It is to be noted that by "amplified" as described herein generally refers to a signal being an output of an amplifier regardless of increased, decreased, or unchanged amplitude of the signal. Thus, an "amplified" signal can be "amplified" by greater than, less than, or equal to unity gain through an amplifier.

The mixer 104 can be a passive or active mixer configured to modulate or frequency-convert a signal, such as down-converting or up-converting, in a signal processing circuit. In embodiments implemented in an RF receiver, the mixer 104 down-converts the input signal IN, such as by down-converting an RF signal to an intermediate frequency (IF). Although not shown in FIG. 1, the mixer 104 may receive one or more additional signals, such as a local oscillator (LO) signal to perform down-converting, for example. In some embodiments, the mixer 104 can be implemented with a passive mixer, ring mixer, and/or double-balanced mixer, such as a Gilbert cell mixer or Gilbert cell quad multiplier block.

The filter 106 can be configured to filter out unwanted signals, such as unwanted harmonics. For instance, in embodiments implemented in a superheterodyne RF receiver, the filter 106 can be an IF bandpass filter having a passband that passes an IF frequency and that filters out unwanted frequencies.

The output amplifier 108 can be implemented with a VGA having a variable gain is controlled by a control signal, such as a control voltage. In the illustrated embodiment, the output amplifier 108 receives the mixed and filtered output from the filter 106, and amplifies or attenuates the mixed and filtered signal based on the control signal it receives from the main loop 110. Additionally, the output amplifier 108 provides the output signal, OUT, of the circuit 100. In embodiments implemented in an RF superheterodyne receiver, the output amplifier 108 can be an IF VGA, and the output signal, OUT, of the circuit 100 is an amplified IF signal.

The main loop 110 is configured to receive the output signal, OUT, of the circuit 100 and provide a control signal to the output amplifier 108 and a control signal to the input amplifier 102 by way of the merger circuit 114. In some embodiments, the main loop 110 can be configured to compare the level of the output signal, OUT, with reference to a main loop reference voltage to control the gain of the amplifiers 102, 108, thereby maintaining the output power at a substantially constant level via feedback. In some embodiments, the main loop 110 can include one or more elements for shaping a response characteristic of the feedback control loop. Further details of the main loop 110 and example embodiments are discussed below in connection with FIGS. 2-6.

The blocker or auxiliary loop 112 is configured to receive the mixer output from the mixer 104 and provide a control signal to the input amplifier 102 by way of the merger circuit 114. In some embodiments, the blocker loop 112 is configured to compare the level of the mixer output of the mixer 104 with reference to a blocker loop reference voltage to control the gain of the input amplifier 102 through the merger circuit 114. In some embodiments, the blocker loop 112 can include one or more elements for shaping a response characteristic of the feedback control loop. Further details of the blocker loop 112 and example embodiments are discussed below in connection with FIGS. 2-6.

In the illustrated circuit 100, the blocker loop 112 is configured to override the main loop 110 in the presence of a blocker signal at the mixer 104. In one embodiment, the blocker loop 112 determines when a blocker signal is present based on comparing the mixer output with the blocker loop reference voltage. Additionally, when the blocker signal is detected, the blocker loop 112 generates a control signal that reduces gain of the input amplifier 102. In this example, through the merger circuit 114, the control signal from the blocker loop 112 can override the control signal from the main loop 110 in controlling the input amplifier 102, and the gain of the input amplifier 102 can be reduced according to the control signal from the blocker loop 112. Continuing with this example, once the gain at the input amplifier 102 is reduced, comparing the output signal, OUT, with the main loop reference voltage in the main loop 110 can yield a control signal that would increase gain of the output amplifier 108, restoring the power of the output signal, OUT. As further discussed below in connection with FIG. 6 below, the parameters of the blocker loop 112 can be adjusted to determine a suitable performance of the blocking function described herein. It is understood that the main loop 110 and the blocker loop 112 can be designed further based on various other design considerations such as response time, loop bandwidth, and/or other characteristics, dynamics, and/or responses of the loops.

As shown in FIG. 1, the merger circuit 114 is coupled to the blocker loop 112 and the main loop 110. The merger circuit 114 can be configured to allow a control signal from the blocker loop 112 to override a control signal from the main loop 110 as appropriate. In some embodiments, the main loop 110 and the blocker loop 112 can be implemented using amplifier based circuits, such as operational amplifiers. In such embodiments, the merger circuit 114 can be implemented with a shorted node having a voltage control by amplifiers of the main loop 110 and the blocker loop 112. In this example, the amplifiers in the blocker loop 112 and the main loop 110 can be designed to have a strong pulling capacity to drive the control signal to the input amplifier 102 in a direction that reduces gain. For example, in an embodiment in which gain decreases with a decrease in control voltage, an amplifier of the blocker loop 112 can be implemented using pull-down circuitry that is stronger than pull-up circuitry of an amplifier of the main loop 110, thereby allowing the blocker loop 112 to override the main loop 110 when the blocker signal is present.

In other embodiments, the merger circuit 114 can also include amplifiers, such as operational amplifiers, such that the shorted node of the merger circuit 114 follows and shorts multiple signal paths, each of which is implemented with amplifier based circuits. The amplifiers followed by the shorted node can also be designed to have a strong pulling capacity to drive the control signal to the input amplifier 102 in a direction that reduces the input amplifier's gain. For example, in an embodiment in which the input amplifier's gain decreases with a decrease in control voltage, the amplifiers of the merger circuit 114 can be implemented with strong pull-down circuitry. In this example, the blocker loop 112 and main loop 110 providing input(s) to the one or more amplifiers of the merger circuit 114 may or may not be amplifier based circuit(s).

Further details of the merger circuit 114 and the design of the operational amplifiers followed by the shorted node of the merger circuit 114 are discussed below in connection with FIGS. 4A-5B.

In some embodiments, one or more of the circuit elements disclosed herein, such as amplifiers, mixers, and/or filters, can be implemented using various technologies using field effect transistors (FETs), such as metal oxide semiconductor (MOS) transistors, which can be in complementary form, junction field effect transistors (JFETs), laterally diffused metal oxide semiconductor (LDMOS) transistors, GaAs metal semiconductor field effect transistors (GaAs MESFETs), pseudomorphic high electron mobility transistors (pHEMTs), or the like. While the terms "metal" and "oxide" may be present in for example, MOS, such transistors can have gates made out of materials other than metals, such as polysilicon, and have dielectric oxide regions made from dielectrics other than silicon oxide, such as a high-κ dielectric. According to some other embodiments, the circuit elements implemented in accordance with the principles and advantages discussed herein can be implemented with bipolar transistors, such as SiGe bipolar transistors or GaAs heterojunction bipolar transistors.

Although not illustrated in FIG. 1, the gain control circuit 100 can include additional one or more filters, amplification circuits, driver stages, mixers, attenuators, and/or other circuitry. As described herein, same or corresponding numerals and/or names of elements in FIGS. 1-4B and their descriptions indicate the elements having similar or corresponding functionalities and/or characteristics.

Figure 2:
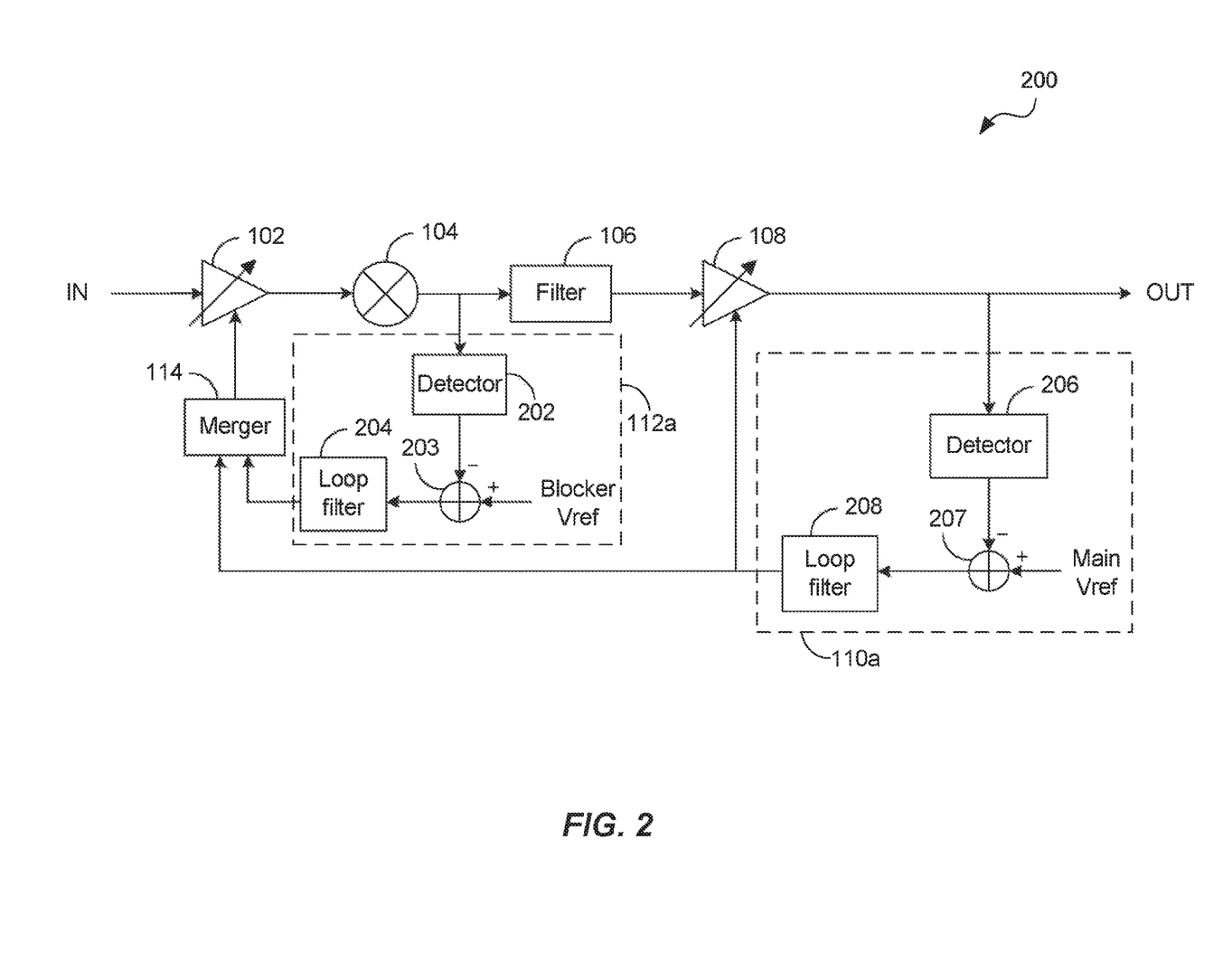
FIG. 2 is a schematic diagram of another embodiment of a gain control circuit.

FIG. 2 is a schematic diagram of another embodiment of a gain control circuit. The gain control circuit 200 illustrated in FIG. 2 includes similar circuit elements corresponding to the elements of the circuit illustrated in FIG. 1. The illustrate circuit 200 also includes a main loop 110a, which is an example of the main loop 110, and a blocker loop 112a, which is an example of the blocker loop 112. The main loop 110a includes a detector 206, a subtractor 207, and a loop filter 208, and the blocker loop 112a includes a detector 202, a subtractor 203, and a loop filter 204.

The main loop detector 206 receives the output signal, OUT, of the circuit 200 to detect the output signal level for comparison at the main loop subtractor 207. The main loop detector 206 can be implemented with any of the variety of detectors, such as a log detector, envelope detector, peak detector, square-law detector, root-mean-square (RMS) detector, or other suitable power detector capable of detecting its input signal level. It is understood that selection and implementation of the main loop detector 206 can be further based on its response characteristics and effect on the main loop 110a.

The main loop subtractor 207 receives the detector output from the main loop detector 206 and a main loop reference voltage, Main Vref, which are compared to one another to produce a subtractor output. In some embodiments, the main loop subtractor 207 can be implemented with a differential amplifier, such as an operational amplifier. In some embodiments, the main loop subtractor 207 can be combined with the main loop filter 208, or some or all of the functionalities of the main loop subtractor 207 can be embedded in the main loop filter 208.

The main loop filter 208 receives the subtractor output from the main loop subtractor 207 and generates a main loop output, which serves as a control signal from the main loop 110a. In some embodiments, the main loop filter 208 can be designed to implement a certain transfer function desired in the feedback loop. As discussed above, in some embodiments, the main loop filter 208 can embed the main loop subtractor 207 functionalities. As described herein, the detector 206, the subtractor 207, and the loop filter 208 in combination are configured to receive the output signal, OUT, and compare the output signal, OUT, with the main loop reference voltage, Main Vref, to generate a main loop control signal for the output amplifier 108 and for the input amplifier 102 by way of the merger circuit 114.

The blocker loop detector 202 receives the mixer output from the mixer 104, and generates a detector output. As such, the blocker loop detector 202 is configured to detect, for example, the presence and level of a blocker signal at the mixer 104 and to output a detector output to the subtractor 203. The blocker loop detector 202 can be implemented with any of the variety of detectors, such as a log detector, envelope detector, peak detector, square-law detector, root-mean-square (RMS) detector, or other suitable power detector capable of detecting its input signal level. It is understood that selection and implementation of the blocker loop detector 202 can be further based on its response characteristics and effect on the blocker loop 112a.

The blocker loop subtractor 203 receives the detector output from the blocker loop detector 202 and a blocker loop reference voltage, Blocker Vref, and compares the two to produce a subtractor output for further processing at the blocker loop filter 204. In some embodiments, the blocker loop subtractor 203 can be implemented with a differential amplifier, such as an operational amplifier. In some embodiments, the blocker loop subtractor 203 can be combined with the blocker loop filter 204, or some or all of the functionalities of the blocker loop subtractor 203 can be embedded in the blocker loop filter 204.

The blocker loop filter 204 receives the subtractor output from the blocker loop subtractor 203 and generates a blocker loop output, which serves as a control signal from the blocker loop 112a. In some embodiments, the blocker loop filter 204 can be designed to implement a certain transfer function desired in the feedback loop. As discussed above, in some embodiments, the blocker loop filter 204 can embed the blocker loop subtractor 203 functionalities. As described herein, the detector 202, the subtractor 203, and the loop filter 204 in combination are configured to receive the mixer output from the mixer 104 and to compare the mixer output with the blocker loop reference voltage, Blocker Vref, to generate a blocker loop control signal for the input amplifier 102 by way of the merger circuit 114.

In some implementations, the control signal from the blocker loop 112a can adjust gain of the input amplifier 102, which can result in the level of the output signal, OUT, being momentarily adjusted, triggering the main loop 110a to generate a control signal to the output amplifier 108 to readjust gain of the output amplifier 108 to restore the desired power level of the output signal, OUT For example, when a blocker signal is detected at the mixer 104, the blocker loop detector 202 outputs a signal indicating the detection of the blocker signal, and the blocker loop subtractor 203 and the blocker loop filter 204 can generate a control signal to lower the gain of the input amplifier 102. When the merger circuit 114 receives the control signal from the blocker loop 112a to lower the gain of the input amplifier 102, the control signal from the blocker loop 112a can override the control signal from the main loop 110a so that the gain of the input amplifier 102 is lowered. In this example, the output signal, OUT, following the lowered gain at the input amplifier 102 can be momentarily reduced, which triggers the main loop 110a to restore power of the output signal, OUT.

As disclosed herein, it can be advantageous to partially decouple the control of the pre-mixing gain (e.g., gain at the input amplifier 102) and the control of the post-mixing gain (e.g., gain at the output amplifier 108) since adjusting the pre-mixing gain based on detecting a blocker signal at the mixer 104 and restoring post-mixing gain can allow effective blocker signal rejection without sacrificing the overall gain or other performance metrics of the receiver. As further discussed below in connection with FIG. 6, a threshold for triggering the blocker loop functionality, which is to control the input amplifier 102 to perform blocking rejection, can be strategically determined based on various parameters.

Figure 3:
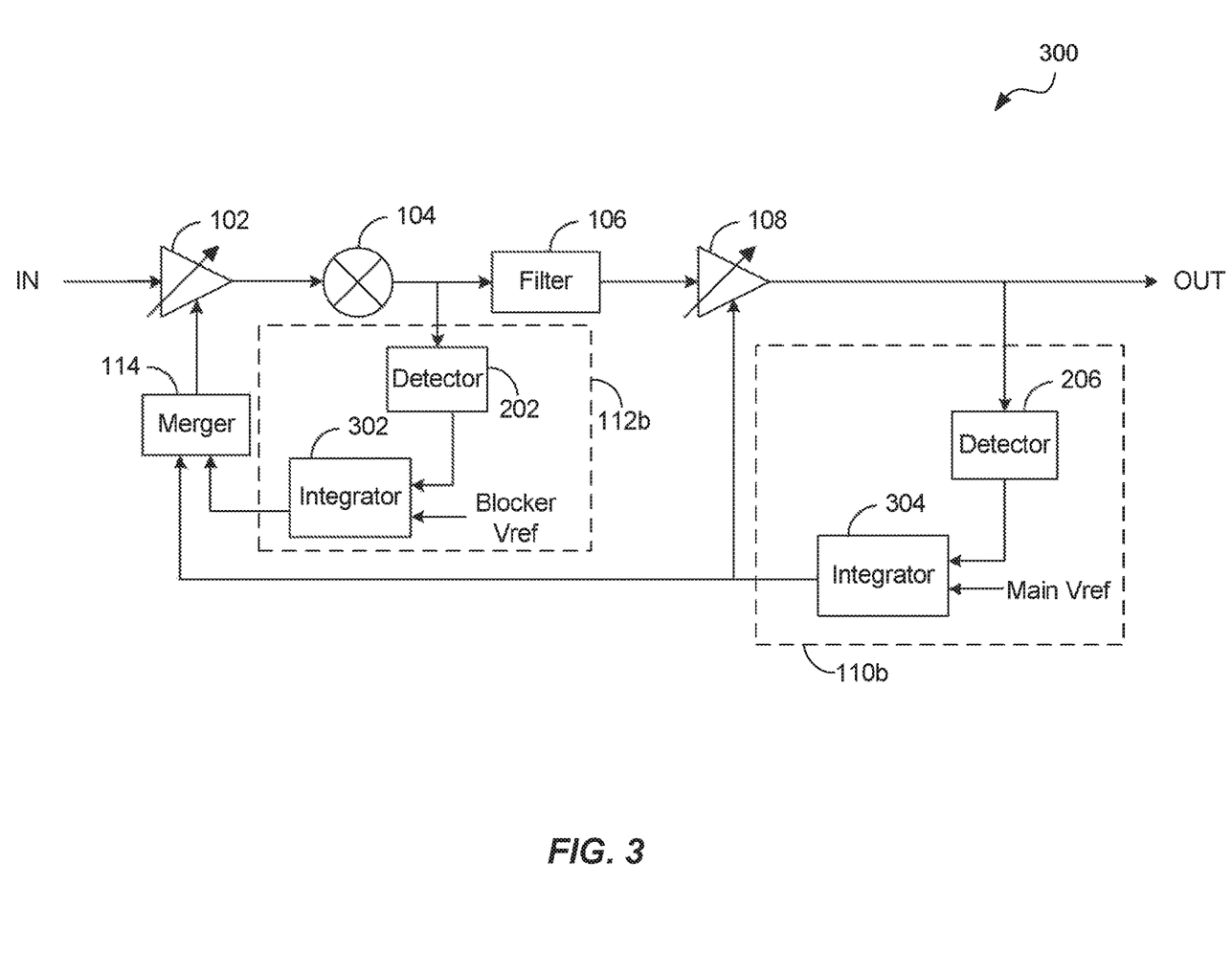
FIG. 3 is a schematic diagram of another embodiment of a gain control circuit.

FIG. 3 is a schematic diagram of another embodiment of a gain control circuit. The gain control circuit 300 illustrated in FIG. 3 includes similar circuit elements corresponding to the elements of the circuit illustrated in FIGS. 1-2. The illustrated gain control circuit 300 also includes a main loop 110b, which is an example of the main loop 110, and a blocker loop 112b, which is an example of the blocker loop 112. The main loop 110b and the blocker loop 112b include similar circuit elements corresponding to the elements of the circuit illustrated in FIG. 2. The main loop 110b also further includes an integrator 304, and the blocker loop 112b also further includes an integrator 302.

The main loop integrator 304 receives the main loop detector output and the main loop reference voltage, Main Vref, and generates a control signal of the main loop 110b. In the illustrated circuit 300, the main loop integrator 304 combines the functionalities of the main loop subtractor 207 (FIG. 2) and the main loop filter 208 (FIG. 2) discussed above. The main loop integrator 304 can be implemented with, for example, an operational amplifier with a capacitive feedback, or any other similar circuit capable of performing integration. In some embodiments, the main loop integrator 304 can further include additional circuit elements to, for example, implement a certain desired transfer function.

The blocker loop integrator 302 receives the blocker loop detector output and the blocker loop reference voltage, Blocker Vref, and generates a control signal of the blocker loop 112b. In the illustrated circuit 300, the blocker loop integrator 302 combines the functionalities of the blocker loop subtractor 203 (FIG. 2) and the blocker loop filter 204 (FIG. 2) discussed above. The blocker loop integrator 302 can be implemented with, for example, an operational amplifier with a capacitive feedback, or any other similar circuit capable of performing integration. In some embodiments, the blocker loop integrator 302 can further include additional circuit elements to, for example, implement a certain desired transfer function.

Figure 4A:
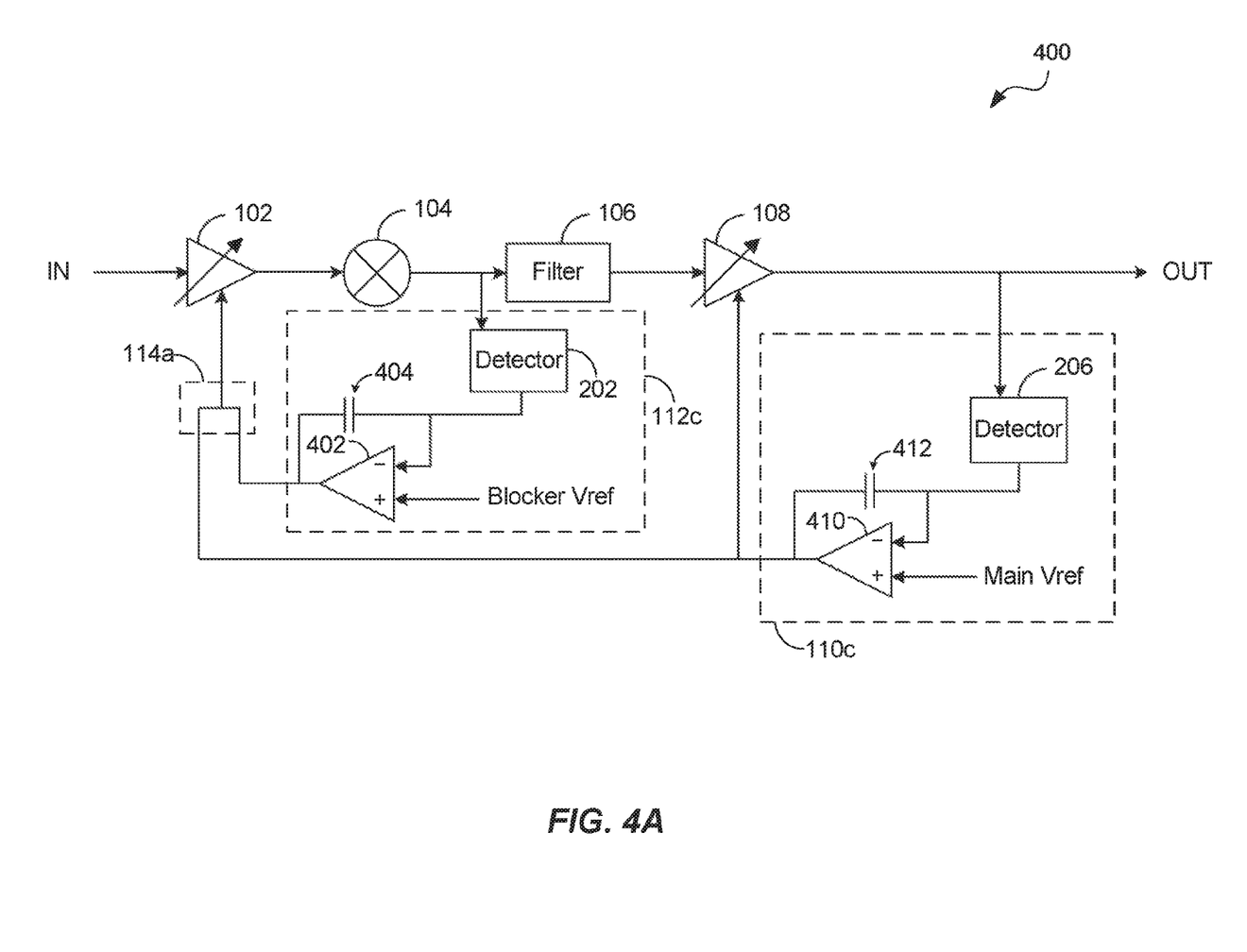
FIG. 4A is a schematic diagram of another embodiment of a gain control circuit.

FIG. 4A is a schematic diagram of another embodiment of a gain control circuit. The gain control circuit 400 illustrated in FIG. 4A includes similar circuit elements corresponding to the elements of the circuit illustrated in FIGS. 1-3. The illustrated gain control circuit 400 also includes a main loop 110c, which is an example of the main loop 110, a blocker loop 112c, which is an example of the blocker loop 112, and a merger circuit 114a, which is an example of the merger circuit 114 of FIGS. 1-3. The main loop 110c and the blocker loop 112c include similar circuit elements corresponding to the elements of the circuit illustrated in FIGS. 2-3. The main loop 110c also includes an operational amplifier 410 and a feedback capacitor 412, and the blocker loop 112c also includes an operational amplifier 402 and a feedback capacitor 404.

The operational amplifier 410 and the feedback capacitor 412 in the main loop 110c implement an example of the main loop integrator 304 (FIG. 3) discussed above. In some embodiments, optional input and/or feedback resistor(s) can be coupled to the operational amplifier 410 to implement a certain transfer function.

The operational amplifier 402 and the feedback capacitor 404 in the blocker loop 112c implement an example of the blocker loop integrator 302 (FIG. 3) discussed above. In some embodiments, optional input and/or feedback resistor (s) can be coupled to the operational amplifier 402 to implement a certain transfer function.

The illustrated merger circuit 114a includes a shorted node following the main loop 110c and the blocker loop 112c, which are operational amplifier based circuits. For example, the control signal from the main loop 110c to the merger circuit 114a is the output of the operational amplifier 410 and the control signal from the blocker loop 112c to the merger circuit 114a is the output of the operational amplifier 402.

In the illustrated embodiment, the operational amplifiers 402 and 410 can be designed so that the control signal from the blocker loop 112c can override the control signal generated by the main loop 110c. For example, in an implementation in which the gain of the input amplifier 102 decreases with a decrease in control voltage, the pull-down networks of the operational amplifiers 402 and 410 are implemented to be stronger than the pull-up networks of the operational amplifiers 402 and 410 to allow the control signal from the blocker loop 112c (i.e., the output of the operational amplifier 402) that would lower the gain of the input amplifier 102 to override the control signal generated by the main loop 110c (i.e., the out of the operational amplifier 410). In this example, the merger circuit 114a following the main loop 110c and the blocker loop 112c implements a MIN function, which allows the lower of the control signals from the main loop 110c and the blocker loop 112c to control the gain of the input amplifier 102. Further details of the merger circuit 114 are discussed in connection with FIGS. 4B-5B below. In another embodiment, the input amplifier 102 is implemented to have a gain that decreases with an increase in control voltage, and the pull-up networks of the operational amplifiers 402 and 410 are implemented to be stronger than the pull-down networks of the operational amplifiers 402 and 410.

Figure 4B:
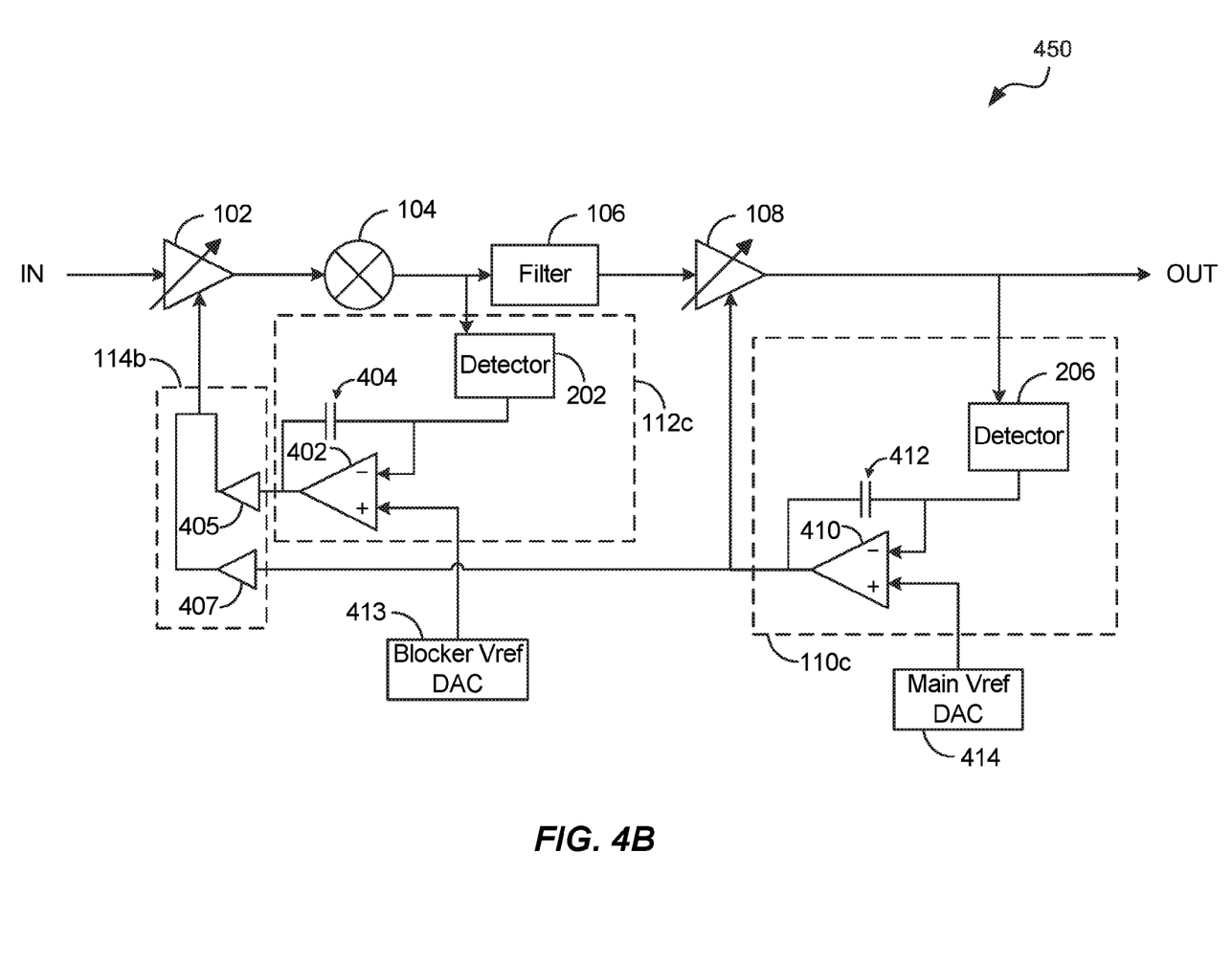
FIG. 4B is a schematic diagram of another embodiment of a gain control circuit.

FIG. 4B is a schematic diagram of another embodiment of a gain control circuit. The gain control circuit 450 illustrated in FIG. 4B includes similar circuit elements corresponding to the elements of the circuit illustrated in FIGS. 1-4A. The illustrated circuit 450 also further includes a merger circuit 114b, which is an example implementation of the merger circuit 114 of FIGS. 1-3, a main loop reference voltage digital-to-analog converter (DAC) 414, and a blocker loop reference voltage DAC 413. The illustrated merger circuit 114b includes an amplifier 407, which is a driver stage amplifier following the main loop 110c and an amplifier 405, which is a driver stage amplifier following the blocker loop 112c.

The driver stage amplifiers 405, 407 can be implemented with amplifiers, such as operational amplifiers. It is to be noted that one or more signals, connections, or elements for the driver stage amplifiers 405, 407 are omitted. The driver stage amplifiers 405, 407 can receive and amplify the respective outputs from the main loop 110c and the blocker loop 112c.

The illustrated merger circuit 114b includes a shorted node following the amplifier 405 and the amplifier 407. Similar to the example merger circuit 114a (FIG. 4A) discussed above, the shorted node of the merger circuit 114b is following operational amplifier based circuits since the shorted node of the merger circuit 114b is coupled to the outputs of the amplifiers 405, 407. In some embodiments, the merger circuit 114b can include one or both of the amplifiers 405, 407 so that it can perform the merging function even when one or more of the prior stages may not be amplifier based circuits. Although the illustrated circuit 450 includes amplifier based circuits (i.e., the main loop 110c and the blocker loop 112c) prior to the amplifiers 405, 407, in other embodiments, one or both of the circuits prior to the amplifiers 405, 407 may not be amplifier based circuits. Further details of the merger circuit 114 are discussed in connection with FIGS. 5A-5B below.

The main loop reference voltage DAC 414 provides the main loop reference voltage, Main Vref (FIG. 4A), to the operational amplifier 410 (FIG. 4A) discussed above. The blocker loop reference voltage DAC 413 provides the blocker loop reference voltage, Blocker Vref (FIG. 4A), to the operational amplifier 402 (FIG. 4A) discussed above. Although omitted in FIG. 4B, the main loop reference voltage DAC 414 and/or the blocker loop reference voltage DAC 413 can be in communication with one or more processors. The one or more processors coupled to the main loop reference voltage DAC 414 and the blocker loop reference voltage DAC 413 can perform computations to determine the appropriate value(s) of the reference voltages for the main loop 110c and the blocker loop 112c.

In some embodiments, the one or both of the reference voltages for the main and blocker loops 110c, 112c can be determined based on various performance parameters of the circuit 450. For example, a processor may determine a threshold value that would strategically allow the blocker loop 112c to perform blocker rejection with reduced or no compromise in performance metrics regarding, for example, signal-to-noise ratio (SNR) and third-order intermodulation (IM3). Further details regarding the selection of a threshold for the blocker loop 112 are discussed in connection with FIG. 6 below.

Figure 5A:
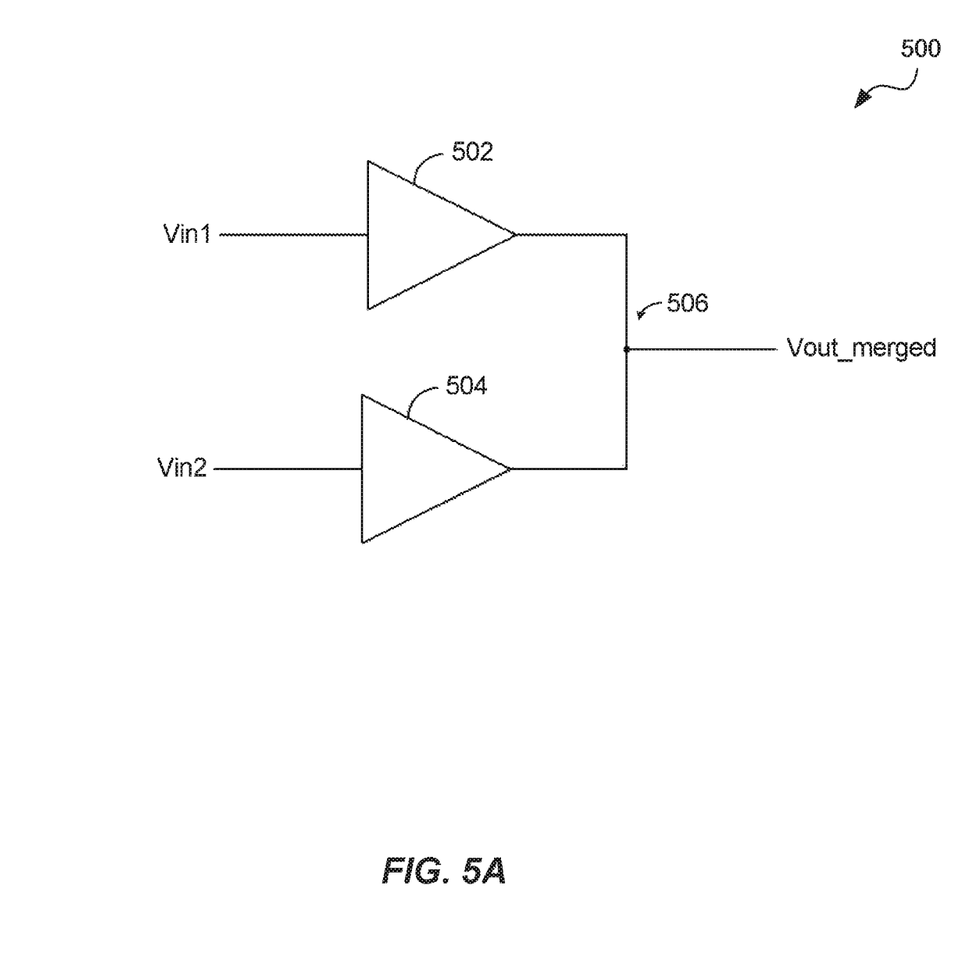
FIG. 5A is a schematic diagram of one embodiment of a merger circuit.

FIG. 5A is a schematic diagram of one embodiment of a merger circuit. The illustrated merger circuit 500 can be an example implementation of the merger circuit 114 of FIGS. 1-3. The merger circuit 500 includes a shorted node 506 following two operational amplifier based circuits 502 and 504. It is to be noted that one or more signals, connections, or elements within the operational amplifier based circuits 502, 504 are omitted. The first operational amplifier based circuit 502 receives the first input, Vin1, and the second operational amplifier based circuit 504 receives the second input, Vin2. Through the shorted node 506, the merger circuit 500 outputs the merged output signal, Vout_merged.

The first and second operational amplifier based circuits 502 and 504 in the illustrated merger circuit 500 are designed to perform either a MIN or a MAX function. For example, one or more operational amplifiers in the circuits 502, 504 coupled to the shorted node 506 can be designed to have a stronger pull-down network(s) than pull-up network(s), which would implement a MIN function. In this MIN function example, the merged output signal, Vout_merged, can be the smaller of the two input signals, Vin1 and Vin2. In another example, one or more operational amplifiers in the circuits 502, 504 coupled to the shorted node 506 can be designed to have a stronger pull-up network (s) than pull-down network(s), which would implement a MAX function. In this MAX function example, the merged output signal, Vout_merged, can be the larger of the two input signals, Vin1 and Vin2.

A merger circuit implementing a MIN function, for example, can be used as the merger circuit 114 in the gain control circuits depicted in FIGS. 1-4B. In other applications, a merger circuit implementing a MAX function can be used as a limiter that limits the output range of an IF VGA, for example. In certain embodiments, one or both of the operational amplifier based circuits 502, 504, which are designed to perform a MIN or MAX function and are followed by the shorted node 506 of the merger circuit 500, can be part of a stage prior to the merger circuit 500. Further details regarding operational amplifier designs that implements a MIN or MAX function are described in connection with FIG. 5B below. Also in some embodiments, the merger circuit 500 can be configured to receive more than two inputs to implement the MIN or MAX function as long as the shorted node 506 is following operational amplifier based circuits that generate the more than two inputs.

Figure 5B:
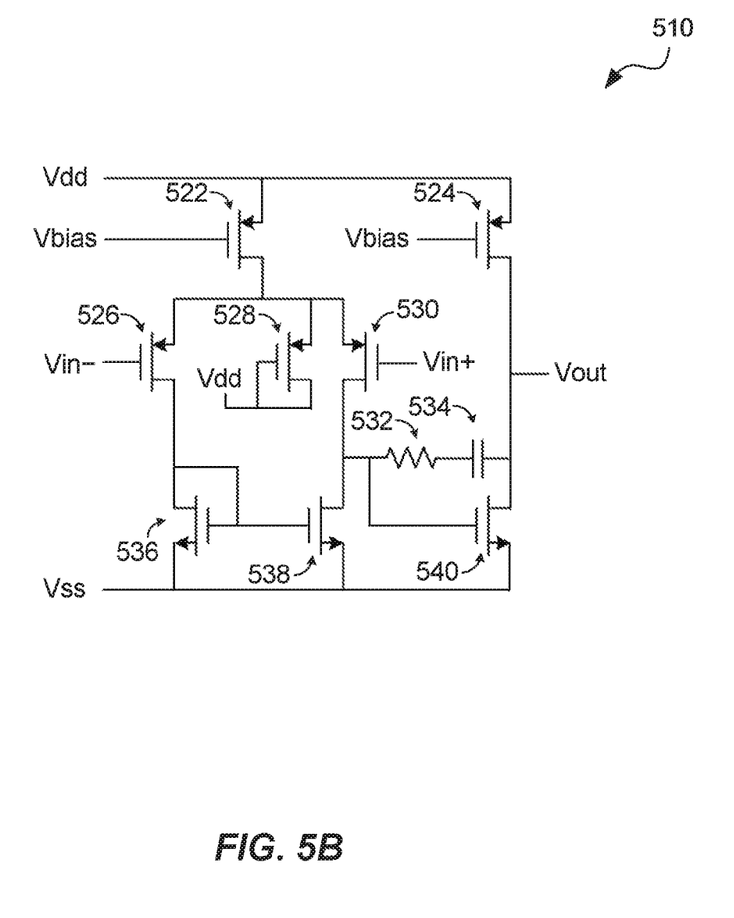
FIG. 5B is a schematic diagram of one example operational amplifier that can be used in a merger circuit.

FIG. 5B is a schematic diagram of one example operational amplifier that can be used for an example merger circuit. The illustrated operational amplifier 510 is an example operational amplifier that can be followed by the shorted node 506 of the merger circuit 500. As discussed above, an operational amplifier (e.g., 510) that is coupled to the shorted node 506 of the merger circuit 500 can be either part of the stage prior to the merger circuit 500 or part of the merger circuit 500 itself. The example operational amplifier 510 includes input stage differential amplifier transistors 526, 530, 536, 538, 522, 528, and gain and output stage transistors 524, 540, resistor 532, and a capacitor 534.

In the illustrated embodiment, the transistor 522 serves a current source used to generate a bias current. Additionally, the transistors 526 and 530 operate as a differential transistor pair that is biased by the bias current from the transistor 522. Furthermore, the transistor 528 is used to bias the sources of the transistors 526 and 530. The transistors 536 and 538 serve as a current mirror load to the differential transistor pair. Additionally, the transistor 540 and 524 operate as a single-ended output stage of the operational amplifier 510, and the resistor 532 and capacitor 534 provide frequency compensation to the operational amplifier 510 to maintain stability.

To implement the MIN or MAX functionality of the merger circuit 500 disclosed herein, the pull-up and pull-down devices in the gain and/or output stage of an operational amplifier can be designed or sized appropriately to adjust the relative strengths of the pull-up and pull-down networks of the operational amplifier. For instance, in the illustrated example operational amplifier 510, the current provided by the PMOS transistor 524 is defined through a current mirror by the gate voltage, Vbias, and the PMOS transistor size (W/L). On the other hand, the NMOS transistor 540 can give much higher current, because its gate voltage is not limited, as it is not tied to a current mirror unlike the PMOS transistor 524. As such, it is understood that the illustrated example operational amplifier 510 gives pull-down current (to Vss) higher than pull-up current (to Vdd). In some embodiments, two copies of the operational amplifier 510, can be shorted together at the shorted node 506 (FIG. 5A) to implement a merger circuit 500 (FIG. 5A). In such embodiments, the pull-down network will take over the pull-up networks due to the design of the operational amplifier 510 regarding the gate voltages of the transistors 524 and 540. Consequently, the merger circuit 500 (FIG. 5A) in this example can perform the MIN function. It is to be noted that further performance parameters can be considered in designing the merger circuit 500 (FIG. 5A) and the operational amplifier 510. For example the sharpness of the transition can be increased by further strengthening the NMOS transistor 540 size.

The amplifiers disclosed herein, such as the operational amplifier 510, can be implemented in complementary versions when appropriate. For example, with reference to the example operational amplifier 510 in FIG. 5B, a complementary version of the operational amplifier 510 can be implemented with the power and ground voltages, Vdd and Vss, swapped, the PMOS transistors 522, 524, 526, 528, 530 substituted with NMOS transistors, the NMOS transistors 536, 538, 540 substituted with PMOS transistors, and the bias voltage, Vbias, adjusted accordingly. For instance, if it is desired to have the opposite, the amplifier 510 can be flipped such that the NMOS transistor 540 is connected to a bias node from a current mirror, while the PMOS transistor 524 is connected to the output node of the first or input stage (i.e., drain of transistor 530 and drain of transistor 538). It is to be noted that the descriptions of the specific amplifiers provided herein only illustrate example implementations, and the merger circuit 114 can be implemented in accordance with the principles and advantages discussed herein with various versions of operational amplifiers.

Figure 6:
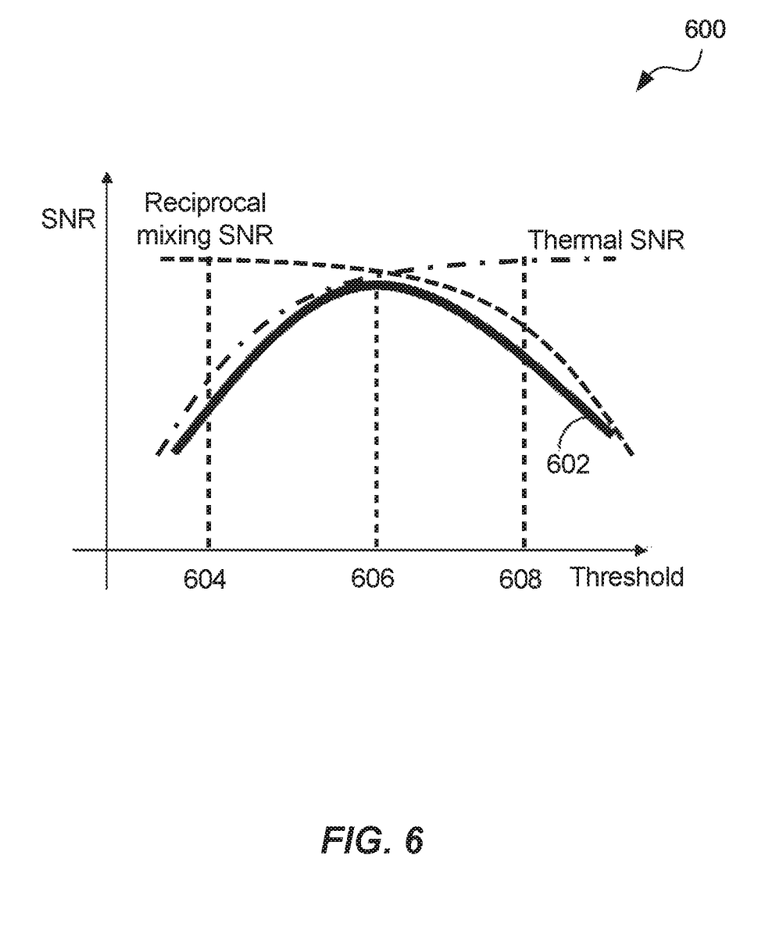
FIG. 6 is a graph illustrating selection of a threshold for a blocker loop of a gain control circuit in accordance with one embodiment.

FIG. 6 is a graph illustrating selection of a threshold for the blocker loop 112 (FIGS. 1-4B). The graph 600 illustrates the general relationships between the SNRs and the threshold for the blocking functionality of the blocker loop 112, and the graph 600 is provided only for illustrative purposes rather than representing any specific values. In the example embodiments discussed above in FIGS. 1-4B, the control signal from the blocker loop 112 to lower the gain of the input amplifier 102 is based on detecting a blocker signal present at the mixer 104. In implementing the blocker signal detection based gain control as disclosed herein, an appropriate threshold of the blocker signal level at the mixer 104 that enables the blocker loop 112 to generate an overriding control signal to lower the gain of the input amplifier 102 should be determined.

The graph 600 illustrates the relationships between the threshold for enabling the blocker loop 112 function and the reciprocal mixing SNR and the thermal SNR. If the blocking threshold is too low (i.e., 604), the blocker loop 112 lowers the gain of the input amplifier 102 even when the level of the blocker signal at the mixer 104 is relatively small. In such implementations, the reciprocal mixing SNR is high since even small blocker signals are being rejected by the blocker loop 112, but the thermal SNR suffers since the gain of the input amplifier 102 is substantially reduced too soon resulting in loss in overall gain. If the blocking threshold is too high (i.e., 608), the blocker loop 112 lowers the gain of the input amplifier 102 only when the level of the blocker signal at the mixer 104 is relatively large. In such implementations, the thermal SNR is high since the gain of the input amplifier 102 is not substantially reduced soon resulting in high overall gain. However, in this instance, the reciprocal mixing SNR suffers since the blocker loop 112 does not reject relatively large blocker signals at the mixer 104.

The solid line 602 traces the combination of the reciprocal mixing SNR and the thermal SNR so that an appropriate threshold level (i.e., 606) can be found that would reduce performance degradation regarding SNR and IM3 when enabling the blocker loop 112.

By adjusting the blocker loop reference voltage, Blocker Vref (FIGS. 1-4A) or input to the blocker loop reference voltage DAC 413 (FIG. 4B), and/or adjusting design or selection parameters of the detector 202 (FIGS. 2-4B), the subtractor 203 (FIG. 2), the loop filter 204 (FIG. 2), the integrator (FIG. 3), the amplifier 402 (FIGS. 4A-4B), and/or the capacitor 404 (FIGS. 4A-4B), the triggering threshold for the blocker loop 112 can be adjusted. In certain embodiments, finding of an appropriate threshold level (i.e., 606) can be performed by a processor coupled to the blocker loop reference voltage DAC 413.

Aspects of this disclosure can be implemented in various electronic devices. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more operations or actions for achieving the described method. The method steps and/or actions may be interchanged with one another without departing from the scope of the claims. In other words, unless a specific order of operations or actions is specified, the order and/or use of specific operations and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus including an automatic gain control (AGC) circuit, the AGC circuit comprising:
   a first AGC portion configured to generate a first control signal based at least partly on a signal level of a down-converted signal;
   a second AGC portion configured to generate a second control signal based at least partly on a signal level of an intermediate frequency (IF) signal; and
   a circuit element configured to generate a first AGC signal for gain control of a radio frequency (RF) amplifier of a receiver based on a combination of gain control information carried by the first control signal and the second control signal, wherein the second control signal is provided to an IF amplifier for gain control such that in a presence of a blocker signal, the first AGC signal from the circuit element reduces a gain of the RF amplifier, and the second control signal from the second AGC portion increases a gain of the IF amplifier.

2. The apparatus of claim 1, wherein the first AGC portion comprises a first detector and a first integrator, wherein the first integrator is configured to provide the first control signal.

3. The apparatus of claim 1, wherein the circuit element comprises a shorted node, wherein the first AGC portion comprises a first operational amplifier configured to provide the first control signal, wherein the second AGC portion comprises a second operational amplifier configured to provide the second control signal, wherein an output network of the first operational amplifier is capable of overriding an output network of the second operational amplifier such that the first AGC signal is dominated by the first control signal upon detection of the presence of the blocker signal.

4. The apparatus of claim 1, wherein the circuit element comprises a first driver stage amplifier configured to amplify the first control signal and a second driver stage amplifier configured to amplify the second control signal, wherein the circuit element is further configured to generate the first AGC signal based on combining an output of the first driver stage amplifier and an output of the second driver stage amplifier.

5. The apparatus of claim 1, further comprising a mixer configured to receive an RF signal from the RF amplifier, wherein the mixer is further configured to generate the down-converted signal.

6. The apparatus of claim 5, further comprising:
   a filter configured to filter the down-converted signal to generate a filtered down-converted signal;
   wherein the IF amplifier configured to amplify the filtered down-converted signal to generate the IF signal.

7. The apparatus of claim 1, wherein the IF amplifier is configured to generate the IF signal.

8. The apparatus of claim 1 wherein the signal level of the IF signal corresponds to an output signal level of the IF amplifier.

9. A method of controlling gain for one or more amplifiers of a receiver, the method comprising:
   generating a first control signal based at least partly on a signal level of a down-converted signal via a first automatic gain control (AGC) portion of an AGC circuit;
   generating a second control signal based at least partly on a signal level of an intermediate frequency (IF) signal using a second AGC portion of the AGC circuit;
   generating a first AGC signal for gain control of a radio frequency (RF) amplifier of the receiver based on a combination of gain control information carried by the first control signal and the second control signal; and
   controlling a gain of an IF amplifier with the second control signal such that in a presence of a blocker signal, the first AGC signal reduces a gain of the RF amplifier and the second control signal increases a gain of the IF amplifier.

10. The method of claim 9, further comprising detecting and integrating a level of the down-converted signal to generate the first control signal.

11. The method of claim 9:
   wherein the first AGC portion comprises a first operational amplifier configured to provide the first control signal,
   wherein the second AGC portion comprises a second operational amplifier configured to provide the second control signal,
   wherein generating the first AGC signal comprises shorting the first control signal and the second control signal together in a shorted node,
   wherein an output network of the first operational amplifier is capable of overriding an output network of the second operational amplifier such that the first AGC signal is dominated by the first control signal upon detection of the presence of the blocker signal.

12. The method of claim 9, further comprising:
   amplifying the first control signal with a first driver stage amplifier;
   amplifying the second control signal with a second driver stage amplifier; and
   generating the first AGC signal based on combining an output of the first driver stage amplifier and an output of the second driver stage amplifier.

13. The method of claim 9, further comprising down-converting an RF signal from the RF amplifier with a mixer to generate the down-converted signal.

14. The method of claim 13, further comprising:
   filtering the down-converted signal to generate a filtered down-converted signal; and
   amplifying the filtered down-converted signal to generate the IF signal.

15. The method of claim 9, wherein the IF amplifier is configured to generate the IF signal.

16. An apparatus including an automatic gain control (AGC) circuit, the AGC circuit comprising:
   a first AGC portion configured to generate a first control signal based at least partly on a signal level of a down-converted signal;
   a second AGC portion configured to generate a second control signal based at least partly on a signal level of an intermediate frequency (IF) signal; and
   a means for generating a first AGC signal for gain control of a radio frequency (RF) amplifier of a receiver based on a combination of gain control information carried by the first control signal and the second control signal, wherein the second control signal is provided to an IF amplifier for gain control such that in a presence of a blocker signal, the first AGC signal from the circuit element reduces a gain of the RF amplifier, and the second control signal from the second AGC portion increases a gain of the IF amplifier.

17. The apparatus of claim 16 further comprising a mixer configured to generate the down-converted signal, wherein the mixer is configured to receive an amplified signal from the RF amplifier.

18. The apparatus of claim 17 further comprising a filter configured to filter the down-converted signal, and to provide a filtered signal to an input of the IF amplifier.

19. The apparatus of claim 16 wherein the signal level of the IF signal corresponds to an output signal level of the IF amplifier.

20. The apparatus of claim 16 further comprising a filter configured to filter the down-converted signal, and to provide a filtered signal to an input of the IF amplifier.

* * * * *